United States Patent [19]

Parikh et al.

[11] Patent Number: 4,724,874
[45] Date of Patent: Feb. 16, 1988

[54] SEALABLE TRANSPORTABLE CONTAINER HAVING A PARTICLE FILTERING SYSTEM

[75] Inventors: Mihir Parikh, San Jose; Anthony C. Bonora, Menlo Park, both of Calif.

[73] Assignee: Asyst Technologies, Milpitas, Calif.

[21] Appl. No.: 840,380

[22] Filed: May 1, 1986

[51] Int. Cl.⁴ .............................................. B65B 1/04
[52] U.S. Cl. ........................................ 141/98; 141/85; 141/383; 414/217; 414/292; 414/414; 414/608; 414/618; 414/733
[58] Field of Search ............................ 312/1, 50, 31.2; 414/217, 733, 220, 618, 222, 608, 287, 292, 403, 414, 422; 141/98, 66, 59, 65, 85, 93, 4, 7, 8, 383–386; 55/301, 302, 490, 512, 516

[56] References Cited

U.S. PATENT DOCUMENTS

| | | | |
|---|---|---|---|
| 3,888,556 | 6/1975 | Strong et al. | 312/1 |
| 4,047,624 | 9/1977 | Dorenbos | 414/217 |
| 4,278,380 | 7/1981 | Guarino | 414/217 |
| 4,359,330 | 11/1982 | Copley | 55/273 |
| 4,434,891 | 3/1984 | Skinner et al. | 206/444 |
| 4,532,970 | 8/1985 | Tullis et al. | 141/98 |
| 4,534,389 | 8/1985 | Tullis et al. | 141/98 |
| 4,540,326 | 9/1985 | Southworth et al. | 414/217 |
| 4,558,982 | 12/1985 | Oakley et al. | 414/220 X |
| 4,592,306 | 6/1986 | Gallego | 414/217 X |
| 4,616,683 | 10/1986 | Tullis et al. | 141/98 |
| 4,674,936 | 6/1987 | Bonora | 414/217 |
| 4,674,939 | 6/1987 | Bonora et al. | 414/292 |
| 4,676,709 | 6/1987 | Bonora et al. | 414/217 |

FOREIGN PATENT DOCUMENTS

0004244  1/1981  Japan .................................. 414/222

*Primary Examiner*—Henry K. Artis
*Assistant Examiner*—Ernest G. Cosick
*Attorney, Agent, or Firm*—Fliesler, Dubb, Meyer & Lovejoy

[57] ABSTRACT

A sealable transportable container for use with processing equipment having a port plate and port door sealably mating to the port plate, the transportable container including a box having an interior space for containing the articles. The box including a conduit for communicating between the interior space and the environment external the box. The conduit including a filter for filtering fluids passing through the conduit. The box including a box top having sealing surfaces and a box door sealably mating with the box top. The port plate also includes sealing surfaces and is sealably mated to the box top. The port door includes a sealing surface and is sealably mated to the port plate. The box door includes a latch for mechanically opening and closing of the box and the port door includes a device for activating the latch.

10 Claims, 13 Drawing Figures

SEALABLE TRANSPORTABLE CONTAINER HAVING A PARTICLE FILTERING SYSTEM

CROSS REFERENCE TO RELATED APPLICATIONS

SEALED STANDARD INTERFACE APPARATUS, Inventors George Allen Maney, Andrew William O'Sullivan, W. George Faraco, Ser. No. 635,384, Filed: July 30, 1984.

INTELLIGENT WAFER CARRIER, Inventors: George Allen Maney, Anthony Charles Bonora, Mihir Parikh, Ser. No. 686,444, Filed: Dec. 24, 1984, now U.S. Pat. No. 4,674,939.

DOOR ACTIVATED RETAINER, Inventors: George Allen Maney, W. George Faraco, Mihir Parikh, Ser. No. 686,443, Filed: Dec. 24, 1984.

LONG ARM MANIPULATOR FOR STANDARD MECHANICAL INTERFACE APPARATUS, Inventors: Anthony Charles Bonora, Andrew William O'Sullivan, Ser. No. 769,709, Filed: Aug. 26, 1985, now U.S. Pat. No. 676,709.

SHORT ARM MANIPULATOR FOR STANDARD MECHANICAL INTERFACE APPARATUS, Inventors: Anthony Charles Bonora, Ser. No. 769,850, Filed: Aug. 26, 1985, now U.S. Pat. No. 4,674,936.

CONTAINER HAVING DISPOSABLE LINERS, Inventors: Mihir Parikh, Anthony Charles Bonora, W. George Faraco, Barney H. Huang, Ser. No. 8,329,447 Filed: Feb. 13, 1986.

BACKGROUND OF INVENTION

The present invention relates to standardized mechanical interface (SMIF) systems for reducing particle contamination and more particularly to transportable containers apparatus which are hermetically sealable.

A standardized mechanical interface (SMIF) has been proposed by the Hewlett-Packard Company as disclosed in U.S. Pat. Nos. 4,532,970 and 4,534,389. The purpose of the SMIF system is to reduce particle fluxes onto wafers. This end is accomplished by mechanically ensuring that during transportation, storage and processing of the wafers, the gaseous media (such as air or nitrogen) surrounding the wafers is essentially stationary relative to the wafers and by ensuring that particles from the ambient environment do not enter the immediate wafer environment.

The SMIF system above consists of two parts: (1) a controlled environment including a clean process equipment canopy surrounding the wafer-handling mechanism of each processing machine, and (2) a small, clean box having a quiet internal environment for carrying wafers from processing machine to processing machine.

Systems of the above type are concerned with particle sizes which range from below 0.1 micrometers to above 200 micrometers. Particles with these sizes can be very damaging in semiconductor processing because of the small geometries employed in fabricating semiconductor devices. Typical semiconductor processes today employ geometries which are 1 micrometer and under. Unwanted contamination particles which have geometries measuring greater than 0.1 micrometer substantially interfere with 1 micrometer geometry semiconductor devices. The trend, of course, is to have smaller and smaller semiconductor processing geometries which today in research and development labs approach 0.1 micrometer and below. In the furture, geometries will become smaller and smaller and hence smaller and smaller contamination particles become of interest.

In typical processing environments today, "clean rooms" are established in which through filtering and other techniques, attempts are made to remove particles having geometries greater than 0.03 micrometers and above. There is a need, however, to improve the processing environment. In a clean room, wafers and other semiconductor processing articles are exposed to the full clean room environment. Since different people, different types of equipment and materials are also present in the clean room environment, the clean room cannot be maintained as particle free as desired. It is virtually impossible to maintain clean rooms free of particles of a 0.1 micrometer size and below.

For this reason, systems such as the SMIF system have come under consideration. The proposed SMIF system, however, has some deficiencies. When SMIF boxes become contaminated, it is very difficult to remove small contaminant particles since the force of attraction of small particles to surfaces of the equipment is very high. When small particles become attached to a surface such as a SMIF box, they are not effectively removed by filtration techniques. Circulating and filtering air or other gas within a box does not readily remove the contamination particles which are attracted and held in contact with surfaces. However, whenever an object such as a SMIF box is disturbed, by bumping for example, many small particles are freed from the surface and find their way as contaminants onto any semiconductor or other article which is present in the box. While scrubbing and washing techniques have been developed for removing small particles from equipment and surfaces, these processes tend to be cumbersome and furthermore are not entirely effective.

There have since been sealable transportable containers such as one described in U.S. Pat. No. 4,434,891, which discloses a container for a magnetic disc pad eye. That container included a top portion having a screw and therefore requiring manual means to remove the contents from the box interior space.

Previous SMIF concepts have included the principle that the wafers move from the transportable container to the processing equipment through various apparatus by disturbing the least amount of air within the processing equipment. Thus the still air concept has prevaded prior SMIF transportable containers. The advantage of this is that any particulates in the air would not damage semiconductor wafers because the air remained relatively still during the transferring process. While this principle is still valid, it has been found that stagnant air too, has many particles which may also cause damage simply by static attraction. The recognition that stagnant air causes contamination and damage has created a need for active localized filtering of the SMIF box and the environments with which the semiconductor articles are exposed. This recognition is a departure from the previous SMIF concept which employed no active filtering means. The need for active filtering at localized areas and under specific conditions and at desired times has been left to this invention.

In accordance with the above background, there is a need for an improved system which can be standardized and which is effective for reducing contamination using an active filtering system.

SUMMARY OF THE INVENTION

The present invention is a transportable container which provides a clean environment for articles to be processed and which employs an active filtering system in localized areas to facilitate cleaning of the container and surrounding environments. The container is used particularly in connection with semiconductor processing equipment which also provides a clean environment and which can be cleaned locally as well. The container is also used to store articles before and after processing. The container is adapted to receive a holder such as a wafer cassette holder for holding one or more articles such as semiconductor wafers.

It is a general object of this invention to provide a sealable transportable container in which the interior environment may be actively filtered as desired.

It is a further object of this invention to provide a sealable transportable container which is cleaned by alternatively pressurizing and evacuating the container through filter means.

It is a further object of this invention to provide a transportable container in which air may be circulated throughout the interior of the container without opening the container.

It is a further object of this invention to provide a port plate having an injector/extractor which has localized intelligence such that it can be actuated to either pressurize or evacuate at appropriate times.

It is a further object of this invention to provide a sealable transportable container as set forth above which includes means for sensing the quality and pressure of the interior space of the container.

It is a further object of this invention to provide a transportable container as set forth above which enhances the SMIF still air concept by matching environments as the wafers are transferred from one location to another.

In a first embodiment of this invention, the transportable container is used with processing equipment having a port plate and a port door sealably mating to the port plate, the container comprises a box defining an interior space for containing articles, such as semiconductor wafers. The box includes conduit for communicating between the interior space and the environment external the box. The conduit including a filter for filtering particles from fluids passing through the conduit. The box includes a box top having first and second box top sealing surfaces and a box door having a first box door sealing surface sealably mating with the first box top sealing surface for making a first seal. The port plate having first and second port plate sealing surfaces sealably mating with the second box top sealing surface for making a second seal. The port door having a first port door sealing surface for sealably mating with the second port plate sealing surface for making a third seal. Box door latch means for latching the box door to the box top, whereby said first seal is made and released by operation of the box door latch means. The port door includes means for activating the box door latch means. The conduit is connected to structure for moving fluids into and out of the box through the filter. Whereby, upon activation of the structure for moving fluids, the interior space is cleaned by being alternatively evacuated and pressurized.

In a preferred embodiment, the box is hermetically sealable and includes activatable circulation means within the box top for circulating air within the interior space. The box top further includes filtering means for filtering air being circulated in the interior space, whereby upon activation of the circulation means, the filtration means traps particles in the interior space thereby cleaning the interior space.

A preferred embodiment of the transportable container in accordance with this invention includes the box top having conduit means for communicating between the interior space and the port plate. The port plate includes conduit means for communicating with the box top conduit means and for sealably mating with an injector/extractor which may be activated to alternately pressurize or evacuate the interior space through a filter in the box top conduit means, thereby cleaning the interior space as it is alternately pressurized and evacuated.

In another preferred embodiment, the box door includes the conduit means for communication between the interior space and the port door, and also includes conduit means for communication with the box door conduit means and further includes means for sealably connecting an injector/extractor. The box door conduit means includes filtering means, whereby upon activation of the injector/extractor the interior space may be evacuated and pressurized through the filtering means, thereby trapping particles and cleaning the interior space.

Thus, it is an advantage of the present invention that the interior space of the transportable container may be cleaned while articles are present within the interior space.

It is a further advantage of the invention to be able to pressurize the interior space to match the pressure of the environment of the processing equipment.

It is a further advantage of the invention to be able to activate a pressurization or evacuation activation means for dynamically cleaning the interior space of the container during the processing of the articles.

These and other objects and advantages of the invention will appear more clearly from the following description in which the preferred embodiments of the invention have been set forth in detail in conjunction with the drawings.

Figures 1, 2:
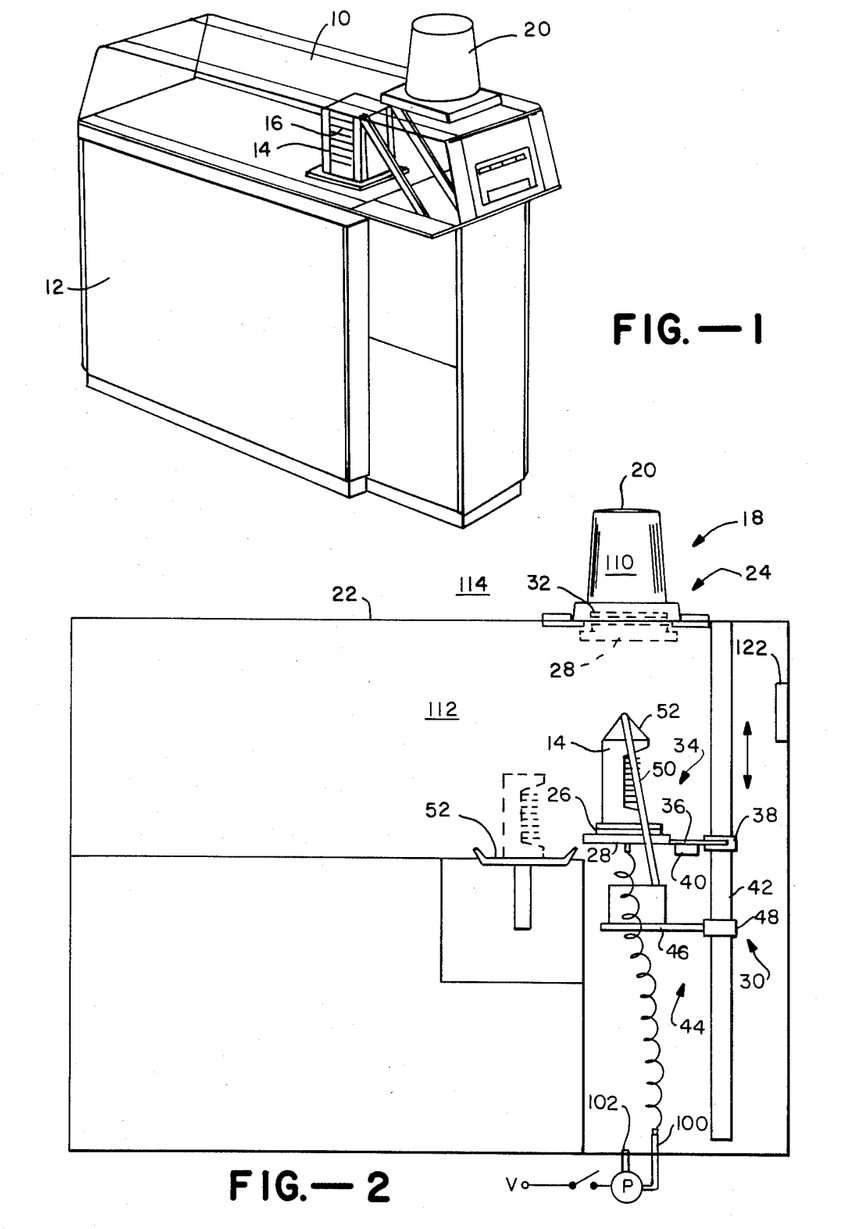
FIG. 1 depicts a prospective view of the SMIF system positioned in use with processing equipment.
FIG. 2 is a schematic representation of one alternative SMIF container in accordance with this invention, shown with the processing equipment of FIG. 1.

DETAILED DESCRIPTION OF THE PREFERRED EMBODIMENTS:

Referring to the Drawings, wherein like-reference characters designate like or corresponding parts throughout the several views and referring particularly to FIG. 1, there is shown a canopy 10 which is an easily removable shield that covers the wafer handing mechanism of the processing equipment 12. Equipment 12 is a photo resist applicator, mask aligner, inspection station or any similar processing equipment. The canopy 10 is constructed of transparent plastic, such as acrylic or Lexan to facilitate inspection and/or maintenance within the canopy 10. The canopy 10 encloses the handling mechanisms of the processing equipment 12 and a holder 14, such as a wafer cassette holding wafers 16. The environment within the processing equipment is separately maintained and separately cleaned and therefore the equipment 12 need not be installed in a clean room.

FIG. 2 shows further details of the apparatus of FIG. 1. A container in accordance with this invention, generally shown by the numeral 18 comprises a box 20 mounted on the horizontal surface 22 of canopy 10 by means of a port assembly 24 and specifically, port plate 26. The port assembly 24 further includes a port door 28 and an elevator mechanism 30 that transports a cassette holder 14, containing the integrated circuit wafers 16 from the box 20 into the region beneath the canopy 10. In FIG. 2, the port door 28 and a box door 32 are shown in the closed position by the dotted lines. A mover assembly 34 includes a platform 36, a shaft engagement means 38 and a drive motor 40. The platform 36, extending from the elevator assembly 30, carries the port door 28, the box door 32 and the holder 14 in a vertical direction. The platform 36 is attached by engagement means 38 to a vertical guide 42 of elevator assembly 30.

Typically, guide 42 includes a lead screw (not shown) and the drive motor 40 drives a gear (not shown) which engages the lead screw for driving the platform 36 up or down. When the platform 36 is driven to the closed position, the port door 28 closes the port opening in the canopy 10.

In a similar manner, a manipulator assembly shown generally by the numeral 44 is fastened to a platform 46 which has an engagement means 48 for engaging the vertical guide 42. Manipulator assembly 44 includes a manipulator arm 50 and an engagement head 52 adapted to engage holder 14. By vertical operation of the platforms 36 and 46 and by operation of the manipulator assembly 44, the holder 14 is moved from its position on the box door 32 to a position on the equipment station 13 (as shown by the broken lines).

Figure 3:
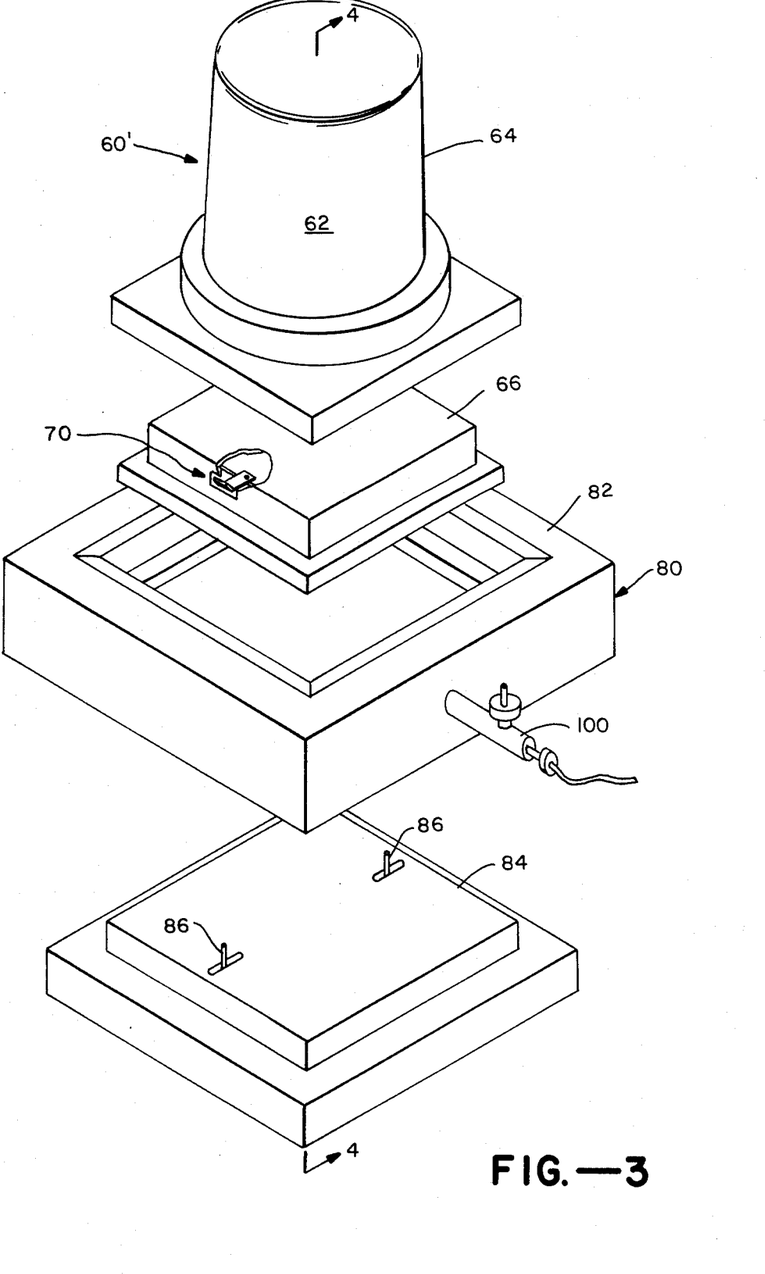
FIG. 3 depicts a prospective view of an hermetically sealable container with a port plate having an injector/extractor means, all in accordance with the present invention.

In FIG. 3 there is shown an exploded view of a first embodiment of a container and port door assembly in accordance with this invention generally indicated by the numerals 60 and 80, respectively. The container 60 comprises a box 62 which is hermetically sealable. The box 62 can be alternately pressurized or evacuated as will be explained more fully below. The box 62 includes a box top 64 and a box door 66. The port assembly 80 includes a port plate 82 and a port door 84. The port plate 82 is connectable to a coaxial injector/extractor 100 at gas transfer valve 68.

The box door 66 includes box door latch means 70. The port door 84 includes pins 86 for actuating the box door latch means 70 and thereby releasing the box door 66 which contains the wafer 16. In this way, the wafers 16 can be moved by elevator mechanism 30 and mover assembly 34 into the proper position in the processing equipment 12 for processing without the need for human intervention.

Figure 4:
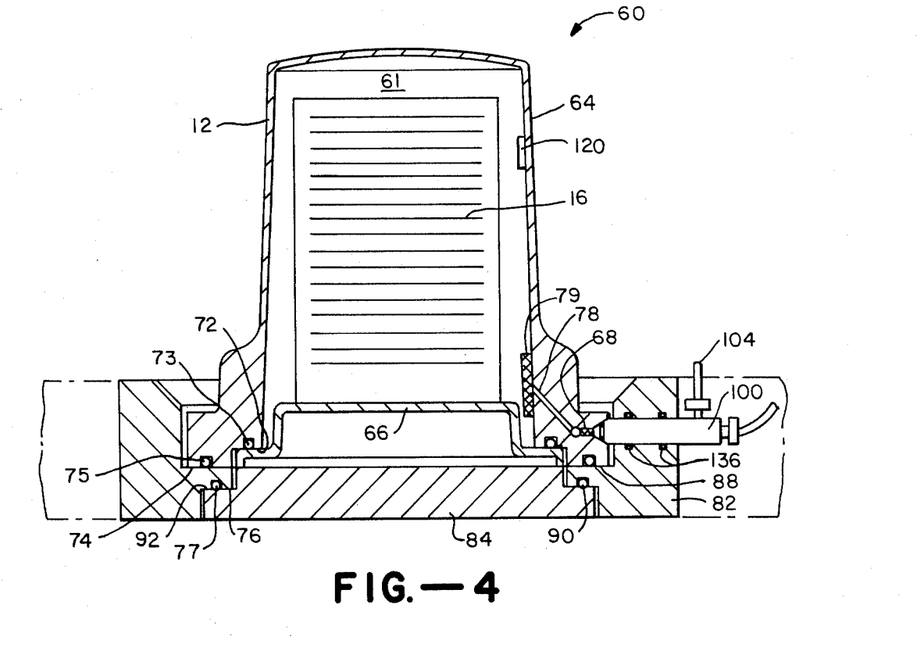
FIG. 4 is a cross sectional view of the embodiment of FIG. 3 of the hermetically sealable container in accordance with this invention taken along lines 4—4 in the direction of the arrows.

In FIG. 4, the container 60 is shown in relation to processing equipment 12. The container 60 is designed for sealably mating with the port assembly 80. The box top 64 has a first and second box top sealing surfaces 72 and 74 respectively. The box door 66 has a first box door sealing surface 76 for sealably mating with the first box top sealing surface 72 and thereby making a first seal 73.

The port plate 82 has first and second port plate sealing surfaces 88 and 90 respectively. The first port plate sealing surface 88 sealably mates with the second box top sealing surface 74 making a second seal 75.

The port door 84 has a first port door sealing surface 92 which sealably mates with the second port plate sealing surface 90 thereby making a third seal 77. The box top 64 further includes a conduit means defining a channel 78 between valve 68 and the interior space 61 of box 62. At one end of the channel 78 is a filtering means 79 for filtering fluids passing therethrough. The filtering means 79 comprises a membrane filter which is particularly effective at trapping small particles.

When all the three seals 73, 75 and 77 are made the box 20 interior space 61 may be cleaned by alternatively evacuating and pressurizing the box 20. In order to evacuate the interior space 61, the injector/extractor 100 is activated to withdraw fluid from the interior space 61. As the fluid is withdrawn, it passes through membrane filter 79, through channel 78 and through a coaxial valve of injector/extractor 100. When a vacuum is created in interior space 61 the process is complete. Using the container of the present invention, a vacuum of between 90-99% has been found possible. After the fluid has been cleaned in the interior space 61 it may then be pumped back into the interior space again through filter 79. The membrane filter 79 keeps the particles within it, even upon pressurization.

During pressurization and evacuation of the container 60, it is preferable that the free flow of air be from the front of the wafers to the back of the wafers to cause the least amount of flux onto the wafers 16.

In FIG. 4, the first, second and third seals 73, 75 and 77, respectively, are all made by use of an O-ring. Further in FIG. 4 it is shown that the injector/extractor 100 is also sealably inserted within port plate 82 by the use of O-rings 136. In order to minimize cost it has been found that the box 62 should be slightly dome and made of a strong plastic material which can withstand 15 PSI differential. The injector/extractor 100 is activated through activation means 104 located in the port assembly 80.

Figure 5:
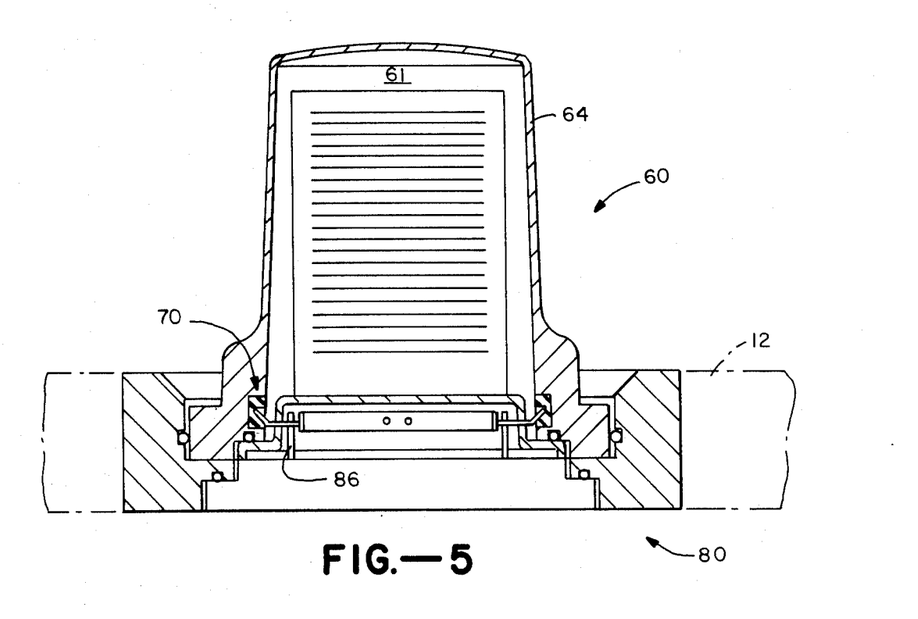
FIG. 5 is another elevated side of the container of FIG. 4 illustrating the box latch means.

In FIG. 5, the box door latch means 70 are shown in detail. The latch means 70 are actuated by port door pins 86 in the same manner as previously described with reference to U.S. Pat. Ser. No. 635,384, which is incorporated herein by reference.

The container in accordance with this invention has the advantage of being able to match environments. The interior space 61 defines a first environment 110 as shown in FIG. 2. A second environment 112 is defined by the interior of the processing equipment 12. A third environment 114 is defined by the space external the container 60 and the processing equipment 12. Prior to the box door 66 being opened, the first environment 110 may be adjusted both as to pressure and as to cleanliness as described above. The second environment 112 may be similarly adjusted when a second injector/extractor 102 is connected to the processing equipment 12. Thus, first and second environments 110 and 112, respectively may then be matched both as to cleanliness and as to pressure. Further when the box door 66 is opened, exposing the wafers 16 to the second environment 112, the pressure and cleanliness may be matched to promote still air transfer of the wafers 16 within the processing equipment 12. Thus the still air wafers concept forth in U.S. Pat. Nos. 4,532,970 and 4,534,389 is enhanced by the present invention.

After processing of the wafers 16, the wafers are reinserted into environment 110. The wafers may then be carried in container 60 through third environment 114 without threat of contamination because of the sealed nature of container 60. Thus, the third environment 114 may be contaminated with many particles without adversely affecting the first environment 110 and thereby wafers 16.

The opening of the box door 66 may be synchronized with the evacuation or pressurization of the container 60. It may be desirable for example to pressurize the first and second environments to 15 PSI prior to the opening of the box door. As explained above the pressure of the environments may be matched using the present invention.

It may be desirable to have the wafers 16 move within the processing equipment with the processing equipment 12 having zero pressure or being in vacuum. Again, environments 110 and 112 may be matched to facilitate still air transfer.

The box top 64 is provided with a sensor 120 which senses both the quality of environment 110 as well as the pressure of environment 110. Similarly, processing equipment 12 is provided with a sensor 122 which senses the pressure and type of environment within the second environment 112. A further discussion of the principles of sensoring the environment 110 is found below with respect to FIG. 13.

Figure 13:
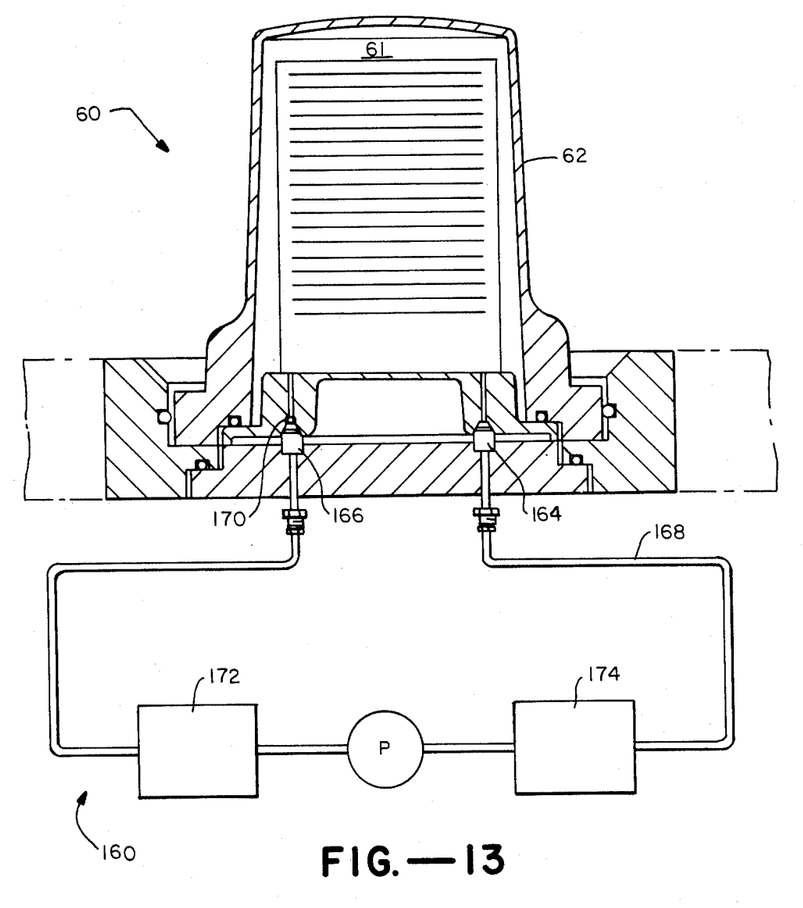
FIG. 13 illustrates yet another embodiment of a container in accordance with this invention having separate inlet and outlet and a closed to filtering system.

In FIG. 13, box 62 is provided with a closed system 160 for filtering and analyzing having an inlet 164 and outlet 166. Clean air or free $N_2$ is pumped by pump P into the interior space 61, circulated through conduit tubing 168 and then exhausted through an outlet. A filter 170 for trapping any particles in the interior space 61 is provided at the outlet 166. Additionally the inlet could also have a filter. Each of the inlet 164 and outlet 166 are one-way valves so that unwanted fluids can not enter the first environment 110. Closed system 160 includes sensor 172 and 174. The sensors 172 and 174 also include attachment to a source of dry nitrogen when it is desirable to pump nitrogen through the closed system 160. The sensors analyze the gas or fluid in interior space 61 both quantitatively and qualitatively. Thus the type of environment including pressure and content can be measured using the container in accordance with this invention.

Figure 12:
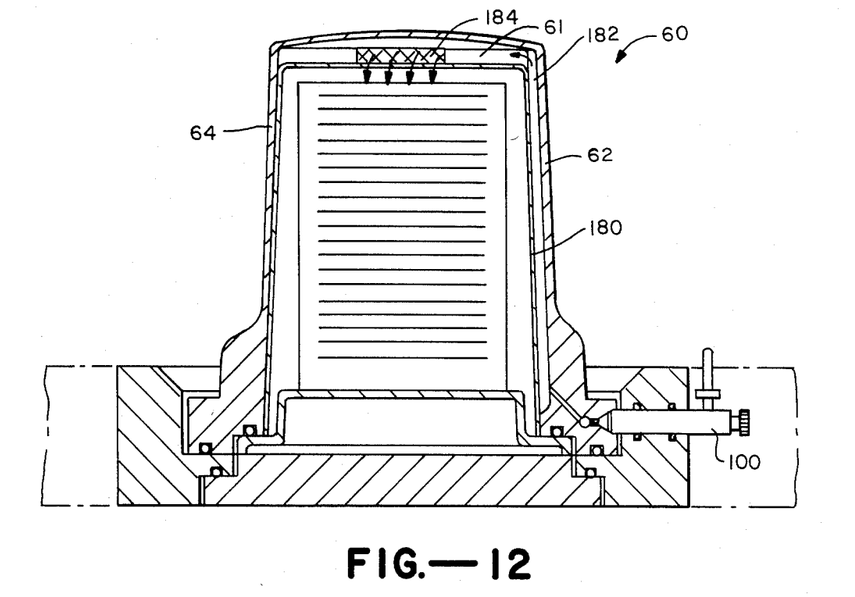
FIG. 12 illustrates another alternative embodiment of the container in accordance with this invention having a liner.

In FIG. 12, the container 60 is shown having a liner 180, similar to the container described with respect to earlier filed U.S. patent application Ser. No. 829,447, filed Feb. 13, 1986 entitled "CONTAINERS HAVING DISPOSALBE LINERS", Invented by Mikir Parikh, Anthony Charles Bonora, W. George Faraco and Barney H. Huang, which is incorporated herein by reference. The liner 180 in the interior space 61. As air in the space 61 is placed in motion it flows through the channel 182 created by the space between the liner 180 and the box top 64. An indentation 184 is provided in the box top 64 creating a further means for directing the air flow in box 62. During injection air follows the general flow indicated by the arrows. Of course upon pressurization, the opposite direction of the arrow would indicate the general air flows. The air flow through a membrane filter 184 seated on top of the liner 180. The filter 184 filters even small particles. The filter 184 is seated on top of the liner 180 so as to provide space between the filter 184 and the box top 64 so that air can flow through that space.

In FIGS. 2, 6 through 9 there is shown another alternative embodiment of a transportable container 60', in accordance with this invention. The container 60', is shown an exploded view in FIG. 8. This embodiment of the present invention is identical to the earlier described embodiment with respect to FIGS. 3 through 5 with the exceptions noted below.

Figure 8:
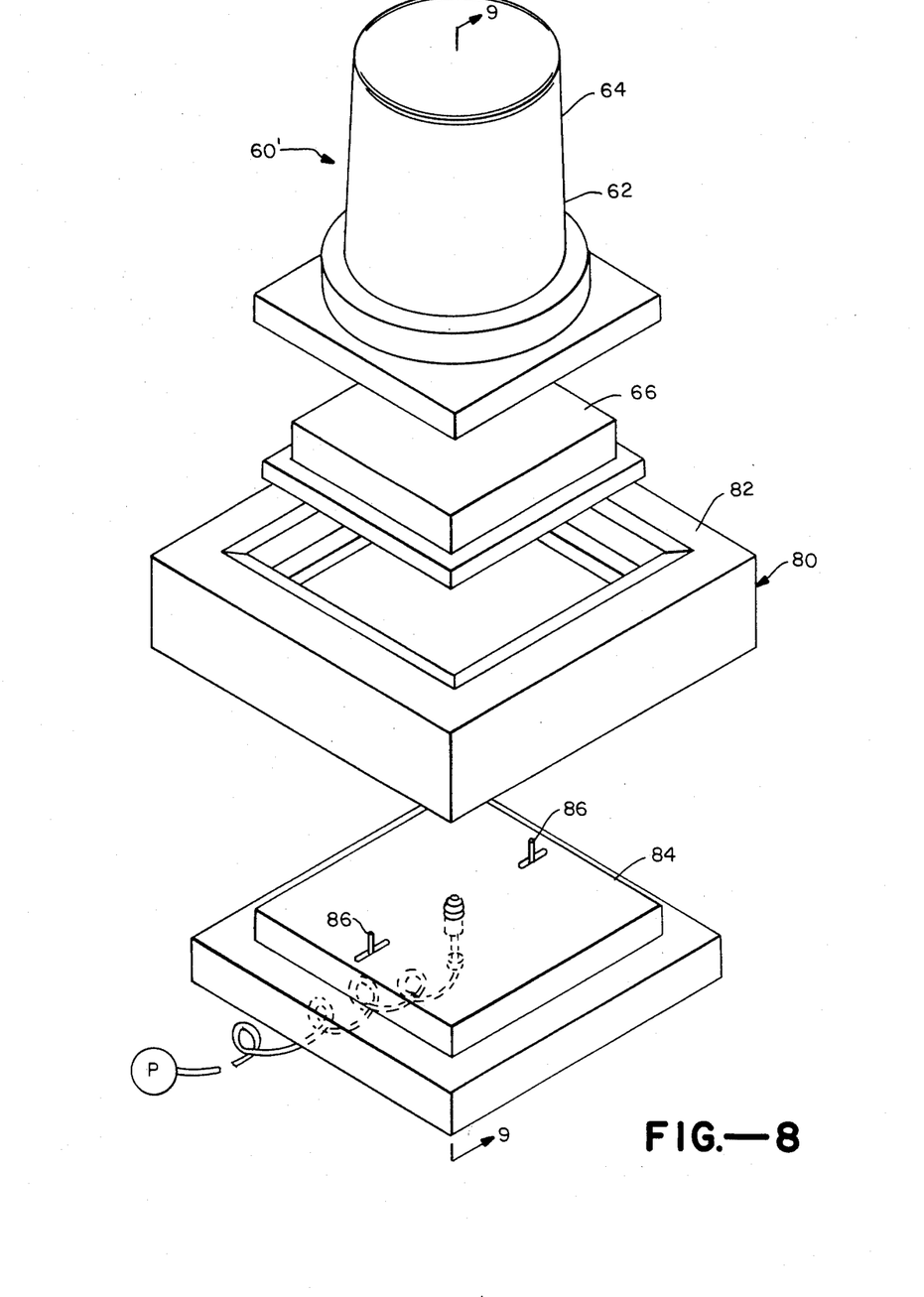
FIG. 8 is an exploded perspective view of an alternate embodiment of the container in accordance with this invention.

The container 60' comprises a box 62 defining an interior space 61 for containing the wafer 16. The box includes a box top 64 having a slightly domed shape and having walls capable of withstanding a 15 PSI pressure differential. The box 62 also includes a box door 66 having conduit means 78 for communication between the interior space and the port door 84. The conduit means 78 defines a channel.

The box top 64 has first and second box top sealing surfaces 72 and 74, respectively. The box door 66 has a first box door sealing surface 76 which sealably mates with first box top sealing surface 72 making a first seal 73.

Figure 9:
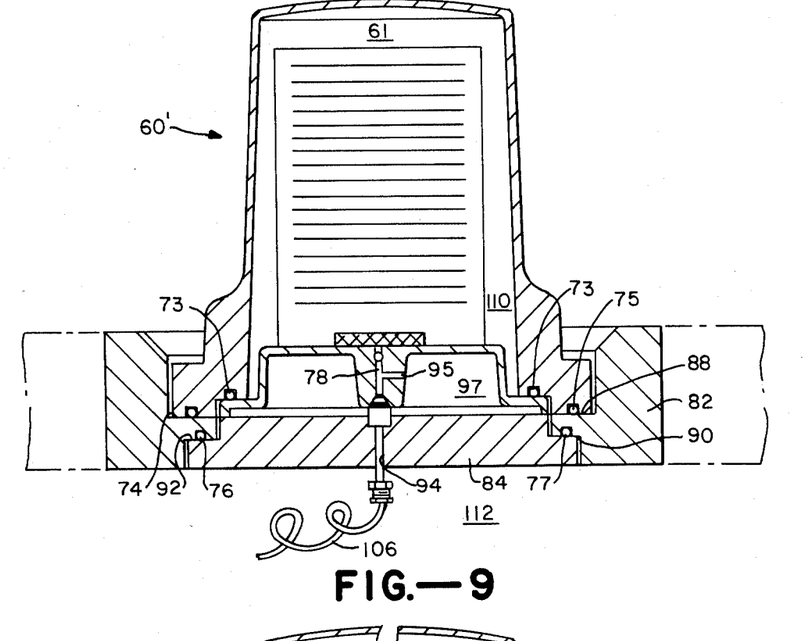
FIG. 9 is a cross sectional view of the container of FIG. 8 taken along lines 9—9 in the direction of the arrows.

The port plate 82 has first and second port plate sealing surfaces 88 and 90, respectively. The first port plate sealing surface 88 sealably mates with the second box top sealing surface 74 for making a second seal 75. The port door 84 has a first port door sealing surface 92 which sealably mates with second port plate sealing surface 90 for making a third seal 77. The port door 84 further includes conduit means defining a channel 94 for communication between the box door 66 and the second environment 112. The box door 66 has conduit means 95 for communication between the space 97 between the port door 84 and box door 66. Using conduit 95 the space 97 may alternatively be evacuated or pressurized with the environments 110 and 112.

In the embodiment shown in FIGS. 2, 6 through 9, the processing equipment 12 includes an injector/extractor 100 connectable through the box door 66. The injector/extractor 100 is connected to the port channel 94 by an umbilical cord 106. The umbilical cord 106 is flexible and moves with the vertical movement of elevator assembly 30 without tangling in the manipulator assembly 50. Similar to earlier embodiment described with respect to FIGS. 3 and 4, this embodiment can also be evacuated and pressurized in a similar manner. In this embodiment, the pressure of the container 60' in combination with the mating of injector/extractor valve 101 upon check valve 98 causes the valve to become activated when the pump P (FIG. 2) is in the "on" position. This embodiment therefore defines a passive system of evacuation and pressurization as compared with the embodiments described with reference to FIGS. 4 and 5, where the pressurization/evacuation occurs by actively switching on the activation means 104.

Figures 6, 7:
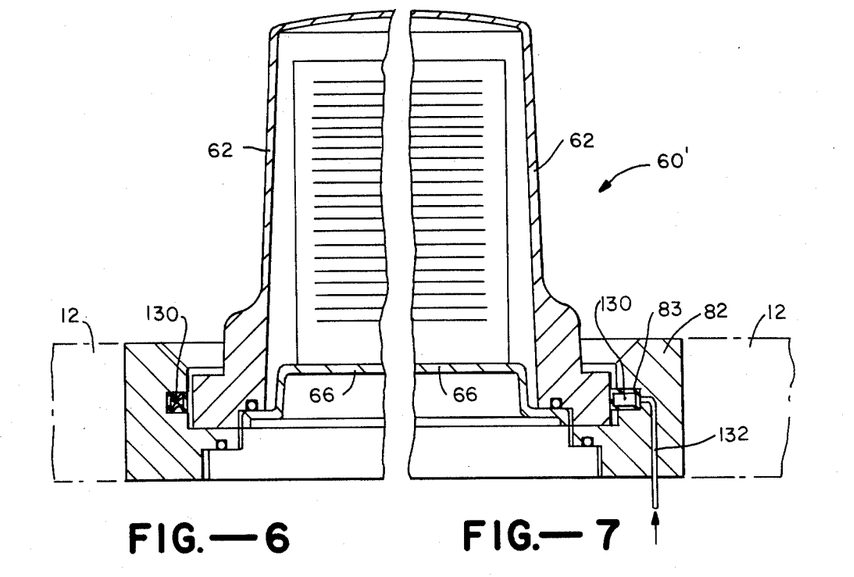
FIGS. 6 and 7 are cross sectional views of another embodiment of the container of FIG. 3 taken along lines 4—4 in the direction of arrows illustrating inflatable sealing means.

In FIGS. 6 and 7, there is shown an alternate sealing structure for sealing the container 60' against port plate 82. The port plate 82 has an internal grove 83 around its inside perimeter. An inflatable seal 130 fits snugly into 9 grove 83. The inflatable seal 130 is connected to a pump (not shown) by conduit 132. After the container 60' has been placed in processing equipment 12, the pump is activated and the seal inflated. To remove the container 60', the seal is deflated and the container 60' released.

Figure 10:
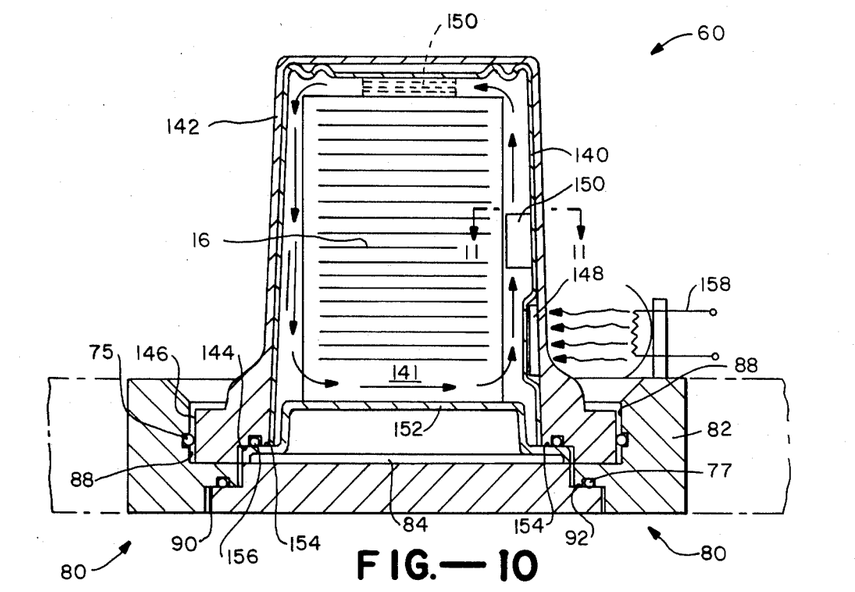
FIG. 10 is an elevated side view of another alternative embodiment of the sealable container in accordance with this invention.

In FIG. 10 there is shown another alternative embodiment of a transportable container 60. In this embodiment particle reduction is accomplished by inducing air circulation within container 60 and trapping particles in a particle gathering element in the interior space. The container 60 comprises an hermetically sealable box 140 defining an interior space 141 for containing the wafers 16. The box 140 includes a box top 142 having first and second box top sealing surfaces 144 and 146 respectively. The box top further includes activatable means for circulating fluid within the interior space definingan absorption plate 148. The box top 142 further includes a particle gathering element 150 for filtering the fluid activated by the absorption plate 148. As shown by the dotted lines, an additional or alternate particle gathering element may be at the top of box 140. It is preferably to have the particle gathering element 150 located on the side of the box top to promote more effective particle gathering. The box 140 includes a box door 152 which has a first box door sealing surface 154 which sealably mates with first box top sealing surface 144 for making a first seal 156.

The container 60 is similar to the previously disclosed embodiments of a transportable container inasmuch as it is designed to work in conjunction with port assembly 80. Like the previously described embodiments, the port plate 82 has first and second port plate sealing surfaces 88 and 90, respectively. The first port plate sealing surface 88 sealably mates with the second box top sealing surface 146 for creating a second seal 75. The port door 84 has a first port door sealing surface 92 which sealably mates with second port plate sealing surface 90 for making a third seal 77. In operation, the box door opens and closes as described with respect to the earlier embodiments in FIGS. 3 through 9.

The absorption plate 148 is heated by direct infrared energy supplied by infrared energy source 158. The infrared energy source is a thermal source which applies heat to the absorption plate 148. The absorption plate 148 in turn heats the interior space 141 at the area closely proximate thereto. The absorption plate 148 is located within the box top 142 and adjacent the box door 152. Thus as the air in the interior space 141 is heated at the bottom, it rises creating a convection current which causes air to circulate through the box top filter 150. It has been found that the absorption plate 148 need only be heated several degrees above the ambient to create this local convection current. As the warmer air rises, it is cooled by the walls of the box top and thereby sustains a continuous circulation. It is expected that circulation rates of several turns per minute can be achieved without raising the temperature of the interior space 141 more than a few degrees above ambient. As the air circulates the particles in the interior space 141 are trapped in the filter 150.

Figure 11:
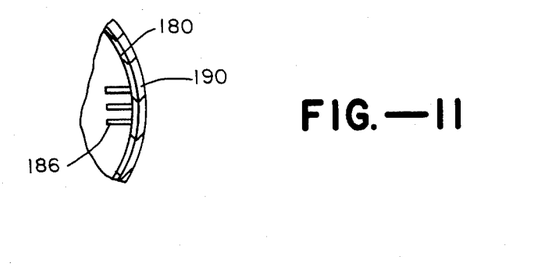
FIG. 11 is a partial sectional enlarged view taken along lines 11—11 in the direction of the arrows illustrating particle collectors.

In FIG. 11, the particle gathering element 184 is shown in detail. The element 184 includes fins 186 which gather particles as the air circulates within the box 140. The pins 186 are positioned such that they do not severely interface with the flow of air.

While the invention has been particularly shown and described with reference to preferred embodiments thereof, it will be understood by those skilled in the art that the foregoing and other changes in form and detail may be made therein without departing from the spirit and scope of the invention.

We claim:

1. For use with processing equipment having a port plate and a port door sealably mating with the port plate, a transportable container for maintaining articles to be processed clean, comprising:
  a box defining an interior space for containing the articles;
  the box including a box top having first and second box top sealing surfaces and a box door having a first box door sealing surface sealably mating with the first box top sealing surfaces for making a first seal;
  conduit means for communicating between the interior space and an environment external to the box;
  filter means for filtering fluids passing through the conduit means;
  the port plate having first and second port plate sealing surfaces, the first port plate sealing surface sealably mating with the second box top sealing surface for making a second seal;
  the port door having a first port door sealing surface for sealably mating with the second port plate sealing surface for making a third seal;
  box door latch means for latching the box door to the box top whereby said first seal is made and released by operation of the box door latch means;
  the port door including means for activating the box door latch means; and
  means for moving fluids into and out of the box through the filtering means, the means for moving fluids being in communication with the conduit means, whereby upon activation of the fluid moving means, the interior space is alternatively evacuated or pressurized.

2. For use with processing equipment having a port plate and a port door sealably mating with the port plate, a container for maintaining articles to be processed clean, comprising:
  a hermetically sealable box defining an interior space for containing the articles;
  the box including:
    a box top having first and second box top sealing surfaces, activatable circulation means for circulating air within the interior space, and
    a box door having a first box door sealing surface sealably mating with the first box top sealing surface for making a first seal;
    filtering means for filtering air within the interior space;

the port plate having first and second port plate sealing surfaces, the first port plate sealing surface sealably mating with the second box top sealing surface for making a second seal;

the port door having a first port door sealing surface sealably mating with the second port plate sealing surface for making a third seal;

box door latch means for latching the box door to the box top for making the first seal; and the port door including means for activating the box door latch means whereby upon activation of the circulation means, fluid circulates throughout the interior space and through the filtering means trapping particles in the interior space.

3. For use with processing equipment having a port plate and a port door mating with the port plate, a container for maintaining articles to be processed clean, comprising:

a box defining an interior space for containing the articles, the box including a box top having an activatable circulation means and a box door for opening and closing the box, the box door including box door latch means for latching the box door to the box top;

filter means for trapping particulates in the fluid and the interior space;

the port plate adapted for receiving the box;

the port door including means for activating the box door latch means;

whereby upon activation of the circulation means fluid moves in the interior space through the filter means trapping particles from the interior space.

4. For use with processing equipment having a port plate and a port door sealably mating with the port plate, a container for maintaining articles to be processed clean, comprising:

a box defining an interior space for containing the articles, the box including:

a box top having conduit means for communicating between the interior space and the port plate, and a box door having a first box door sealing surface sealably mating with the first box top sealing surface for making a first seal;

filter means in communication with the conduit means for filtering fluids which flow into and out of the interior space;

fluid moving means for moving fluid into and out of the box;

the port plate having first and second port plate sealing surfaces, the first port plate sealing surface sealably mating with the second box top sealing surface for making a second seal, the port plate adapted for receiving the fluid moving means, the fluid moving means engaging the conduit means when in the port plate and being selectively activatable;

the port door having a first port door sealing surface sealably mating with the second port plate sealing surface for making a third seal;

box door latch means for latching the box door to the box top for making the first seal; and the port door including means for activating the port door latch means, whereby upon activation of the fluid moving means the interior space may be alternatively pressurized or evacuated through the port plate.

5. For use with processing equipment having a port plate and a port door sealably mating with the port plate, a container for maintaining articles to be processed clean, comprising:

a box defining an interior space for containing the articles, the box including:

a box top having first and second box top sealing surfaces, and a box door having a first box door sealing surface for sealably mating with the first box top sealing surface for making a first seal, first conduit means for communicating between the interior space and the port door;

filter means for filtering fluids passing through the first conduit means;

the port plate having first and second port plate sealing surfaces, the first port plate sealing surface sealably mating with the second box top sealing surface for making a second seal;

the port door having a first port door sealing surface sealably mating with the second port plate sealing surface for making a third seal and second conduit means for communicating with the first conduit means;

box door latch means for latching the box door to the box top for making the first seal;

the port door including means for activating the box door latch means;

the processing equipment including third conduit means in communication with the second conduit means for facilitating communication of the interior space with means for moving fluid into and out of the interior space through the filter means, whereby upon activation of the fluid moving means the interior space may be alternately pressurized or evacuated through the port door.

6. A transportable container for maintaining articles to be processed clean, comprising:

a box defining an interior space for containing the articles, the box including conduit means for communicating between the interior space and the environment external to the box;

filter means for filtering fluids passing through the conduit means;

a box including a box top having first and second box top sealing surfaces and a box door having a first box door sealing surface sealably mating with the first box top sealing surfaces for making a first seal;

a port plate having first and second port plate sealing surfaces, the first port plate sealing surface sealably mating with the second box top sealing surface for making a second seal;

the port door having a first port door sealing surface for sealably mating with the second port plate sealing surface for making a third seal;

box door latch means for latching the box door to the box top whereby said first seal is made and released by operation of the box door latch means;

the port door including means for activating the box door latch means; and means for moving fluids into and out the box through the filter means, the means for moving fluids being connected to the conduit means, whereby upon activation of the fluid moving means, the interior space is alternatively evacuated or pressurized.

7. A container for maintaining articles to be processed clean, comprising:

a hermetically sealable box defining an interior space for containing the articles;
the box including:
a box top having first and second top sealing surfaces, activatable circulation means for circulating air within the interior space, and
a box door having a first box door sealing surface sealably mating with the first box top sealing surface for making a first seal;
filtering means for filtering air within the interior space;
a port plate having first and second port plate sealing surfaces, the first port plate sealing surface sealably mating with the second box top sealing surface for making a second seal;
a port door having a first port door sealing surface sealably mating with the second port plate sealing surface for making a third seal;
box door latch means for latching the box door to the box top for making the first seal; and
the port door including means for activating the box door latch means whereby upon activation of the circulation means, fluid circulates throughout the interior space and through the filtering means trapping particles in the interior space.

8. A container for maintaining articles to be processed clean, comprising:
a box defining an interior space for containing the articles, the box including a box top having an activatable circulation means and a box door for opening and closing the box, the box door including box door latch means for latching the box door to the box top;
filter means for trapping particulates in the fluid and the interior space;
a port plate adapted for receiving the box;
a port door including means for activating the box door latch means;
whereby upon activation of the circulation means fluid moves in the interior space through the filter means trapping particles from the interior space.

9. A container for maintaining articles to be processed clean, comprising:
a box defining an interior space for containing the articles, the box including:
a box top having conduit means for communicating between the interior space and the port plate, and first and second box top sealing surfaces, and
a box door having a first box door sealing surface sealable mating with the first box top sealing surface for making a first seal;
filter means in communication with the conduit means for filtering fluids which flow into or out of the interior space;
fluid moving means for moving fluid into and out of the box;
a port plate having first and second port plate sealing surfaces, the first port plate sealing surface sealably mating with the second box top sealing surface for making a second seal, the port plate adapted for receiving the fluid moving means, the fluid moving means engaging the conduit means when received in the port plate;
a port door having a first port door sealing surface sealably mating with the second port plate sealing surface for making a third seal;
box door latch means for latching the box door to the box top for making the first seal; and
the port door including means for activating the port door latch means, whereby upon activation of the fluid moving means, whereby the interior space may be alternatively pressurized or evacuated through the port plate.

10. A container for maintaining articles to be processed clean for use with the processing equipment, comprising:
a box defining an interior space for containing the articles, the box including:
a box top having first and second box top sealing surfaces, and
a box door having a first box door sealing surface for sealably mating with the first box top sealing surface for making a first seal, first conduit means for communicating between the interior space and the port door;
filter means, in communication with the conduit means, for filtering fluids passing through the conduit means;
a port plate having first and second port plate sealing surfaces, the first port plate sealing surface sealably mating with the second box top sealing surface for making a second seal;
a port door having a first port door sealing surface sealably mating with the second port plate sealing surface for making a third seal and second conduit means for communicating with the first conduit means;
box door latch means for latching the box door to the box top for making the first seal;
the port door including means for activating the box door latch means;
the processing equipment including third conduit means in communication with the second conduit means for facilitating communication of the interior space with means for moving fluid into and out of the interior space through the filtering means, whereby upon activation of the fluid moving means the interior space may be alternately pressurized or evacuated through the port door.

* * * * *